United States Patent
Hu et al.

(10) Patent No.: US 11,678,557 B2
(45) Date of Patent: Jun. 13, 2023

(54) DISPLAY SUBSTRATE AND METHOD OF MANUFACTURING THE SAME, DISPLAY DEVICE

(71) Applicant: BOE TECHNOLOGY GROUP CO., LTD., Beijing (CN)

(72) Inventors: Chunjing Hu, Beijing (CN); Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 173 days.

(21) Appl. No.: 16/616,025

(22) PCT Filed: Apr. 3, 2019

(86) PCT No.: PCT/CN2019/081300
§ 371 (c)(1),
(2) Date: Nov. 22, 2019

(87) PCT Pub. No.: WO2019/192529
PCT Pub. Date: Oct. 10, 2019

(65) Prior Publication Data
US 2020/0091251 A1 Mar. 19, 2020

(30) Foreign Application Priority Data
Apr. 4, 2018 (CN) .......................... 201810305257.6

(51) Int. Cl.
*H10K 59/88* (2023.01)
*H10K 59/122* (2023.01)

(52) U.S. Cl.
CPC .......... *H10K 59/88* (2023.02); *H10K 59/122* (2023.02); *H10K 71/00* (2023.02); *H10K 71/135* (2023.02); *H10K 59/1201* (2023.02)

(58) Field of Classification Search
CPC ..................... H01L 27/3223; H01L 27/3246
See application file for complete search history.

(56) References Cited

U.S. PATENT DOCUMENTS

| 8,004,187 B2 | 8/2011 | Tzen et al. |
| 2004/0207577 A1 | 10/2004 | Ito et al. |

(Continued)

FOREIGN PATENT DOCUMENTS

| CN | 1943879 A | 4/2007 |
| CN | 1988136 A | 6/2007 |

(Continued)

OTHER PUBLICATIONS

International Search Report and Written Opinion issued in corresponding International Application No. PCT/CN2019/081300, dated Jul. 4, 2019, with English translation.

(Continued)

*Primary Examiner* — Lauren R Bell
(74) *Attorney, Agent, or Firm* — McDermott Will & Emery LLP

(57) ABSTRACT

A display substrate has a display area and a non-display area. The non-display area includes a dummy pixel area located in a periphery of the display area. The display substrate includes a substrate; a first pixel defining layer disposed on the substrate and located in the display area, the first pixel defining layer having a plurality of first openings; and a second pixel defining layer disposed on the substrate and located in the dummy pixel area, the second pixel defining layer having a plurality of second openings. A capacity of a second opening is greater than a capacity of a first opening, and an open area of a second opening is less than or equal to an open area of a first opening.

17 Claims, 6 Drawing Sheets

(56) References Cited

U.S. PATENT DOCUMENTS

| | | | |
|---|---|---|---|
| 2007/0138943 A1 | 6/2007 | Tano et al. | |
| 2010/0193791 A1 | 8/2010 | Chun | |
| 2016/0247862 A1* | 8/2016 | Song | H01L 51/5012 |
| 2016/0351635 A1 | 12/2016 | Li | |
| 2016/0372528 A1* | 12/2016 | Kamura | H01L 51/5284 |
| 2016/0372670 A1 | 12/2016 | Min | |
| 2018/0374909 A1* | 12/2018 | Nishikiori | H01L 27/3246 |
| 2019/0198811 A1* | 6/2019 | Choi | H01L 51/5256 |
| 2019/0386074 A1* | 12/2019 | Li | H01L 27/3246 |
| 2020/0091251 A1 | 3/2020 | Hu et al. | |

FOREIGN PATENT DOCUMENTS

| | | |
|---|---|---|
| CN | 104393192 A | 3/2015 |
| CN | 108336123 A | 7/2018 |

OTHER PUBLICATIONS

First Office Action issued in corresponding Chinese Application No. 201810305257 6, dated Apr. 1, 2020, with English translation.

* cited by examiner

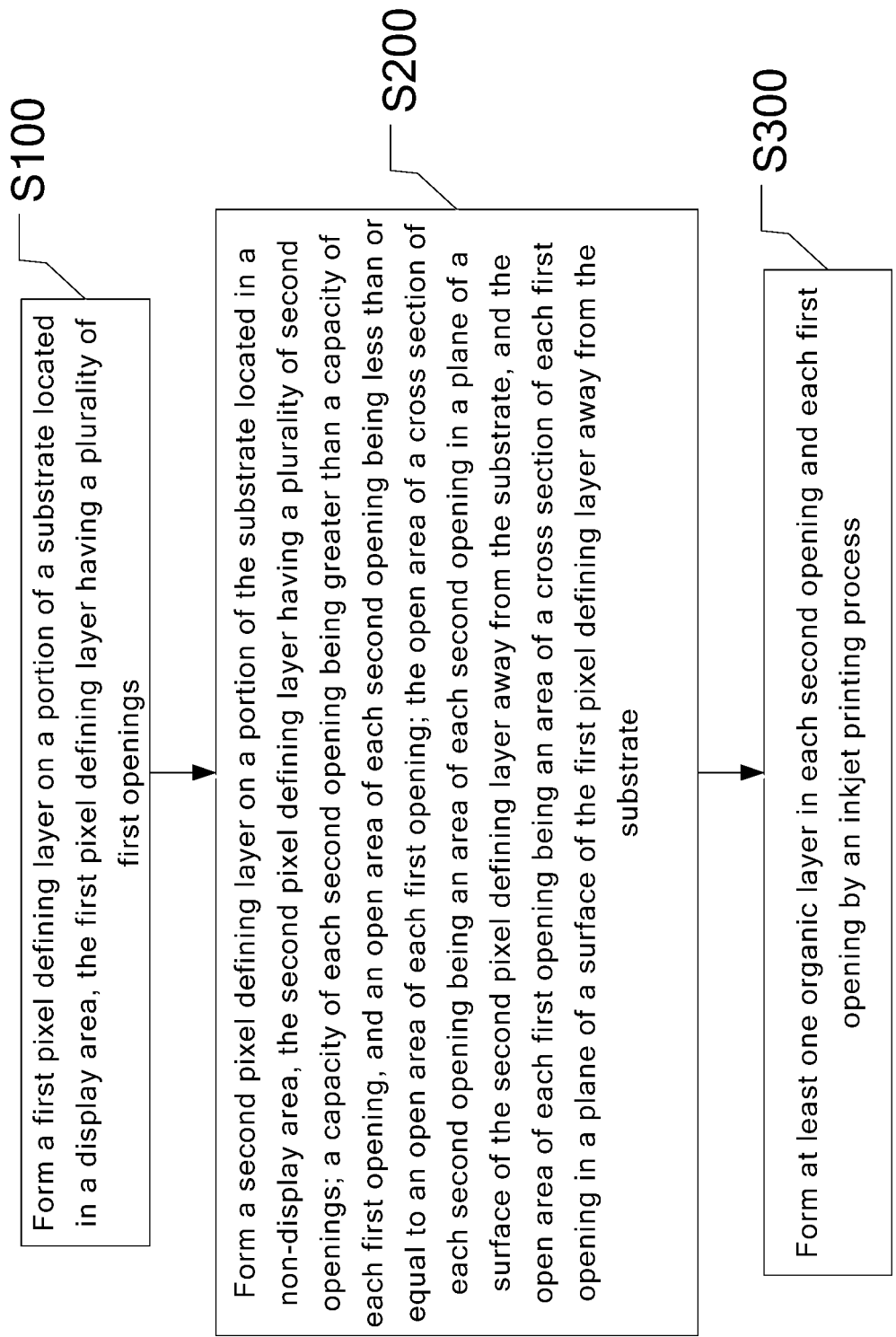

FIG. 5

S100: Form a first pixel defining layer on a portion of a substrate located in a display area, the first pixel defining layer having a plurality of first openings S200: Form a second pixel defining layer on a portion of the substrate located in a non-display area, the second pixel defining layer having a plurality of second openings; a capacity of each second opening being greater than a capacity of each first opening, and an open area of each second opening being less than or equal to an open area of each first opening; the open area of a cross section of each second opening being an area of each second opening in a plane of a surface of the second pixel defining layer away from the substrate, and the open area of each first opening being an area of a cross section of each first opening in a plane of a surface of the first pixel defining layer away from the substrate S300: Form at least one organic layer in each second opening and each first opening by an inkjet printing process

DISPLAY SUBSTRATE AND METHOD OF MANUFACTURING THE SAME, DISPLAY DEVICE

CROSS-REFERENCE TO RELATED APPLICATION

This application is a national phase entry under 35 USC 371 of International Patent Application No. PCT/CN2019/081300 filed on Apr. 3, 2019, which claims priority to and benefits of Chinese Patent Application No. 201810305257.6, filed on Apr. 4, 2018, which are incorporated herein by reference in their entirety.

TECHNICAL FIELD

The present disclosure relates to the field of display technologies, and more particularly, to a display substrate and a method of manufacturing the same, and a display device.

BACKGROUND

In an organic light-emitting diode (OLED) display substrate, an OLED device includes an anode, at least one organic layer, and a cathode. The at least one organic layer may be one or more of a light-emitting layer, a hole transport layer, an electron transport layer, a hole injection layer, and an electron injection layer. In a case where the organic layer is formed by an inkjet printing process, a pixel defining layer is first formed on a substrate, and then a liquid organic material having an organic solvent is printed into a plurality of openings in the pixel defining layer.

SUMMARY

In a first aspect, a display substrate is provided. The display substrate has a display area and a non-display area, the non-display area including a dummy pixel area located in a periphery of the display area. The display substrate includes: a substrate; a first pixel defining layer disposed on the substrate and located in the display area, the first pixel defining layer having a plurality of first openings; and a second pixel defining layer disposed on the substrate and located in the dummy pixel area, the second pixel defining layer having a plurality of second openings. A capacity of a second opening is greater than a capacity of a first opening, and an open area of a second opening is less than or equal to an open area of a first opening.

In some embodiments, in a direction from each first opening to the substrate, an area of a cross section of at least one first opening parallel to a surface of the substrate decreases progressively. At least one second opening includes a first sub-opening, and a second sub-opening that is located on a side of the first sub-opening away from the substrate and communicated with the first sub-opening. In a direction from each second opening to the substrate, an area of a cross section of the second sub-opening parallel to the surface of the substrate decreases progressively, an area of a cross section of the first sub-opening parallel to the surface of the substrate increases progressively.

In some embodiments, in at least one second opening, a height of the first sub-opening is the same as a height of the second sub-opening.

In some embodiments, in a direction from each opening to the substrate, an area of a cross section of at least one first opening parallel to a surface of the substrate decreases progressively, and an area of a cross section of at least one second opening parallel to a surface of the substrate increases progressively.

In some embodiments, the first pixel defining layer and the second pixel defining layer are both photoresist layers.

In a second aspect, a display device is provided. The display device includes the display substrate of the first aspect.

In a third aspect, a method of manufacturing a display substrate is provided. The method of manufacturing a display substrate includes: forming a first pixel defining layer on a portion of a substrate located in a display area, the first pixel defining layer having a plurality of first openings; and forming a second pixel defining layer on a portion of the substrate located in a non-display area, the second pixel defining layer having a plurality of second openings. A capacity of a second opening is greater than a capacity of a first opening, and an open area of a second opening is less than or equal to an open area of a first opening.

In some embodiments, forming a first pixel defining layer on a portion of a substrate located in a display area, the first pixel defining layer having a plurality of first openings, includes: forming a photoresist layer on the portion of the substrate located in the display area by a coating process; and exposing and developing the photoresist layer to form the first pixel defining layer having the plurality of first openings.

In some embodiments, forming a second pixel defining layer on a portion of the substrate located in a non-display area, the second pixel defining layer having a plurality of second openings, includes: forming a negative photoresist layer on the portion of the substrate located in the non-display area by a coating process; exposing and developing the negative photoresist layer to form a plurality of first sub-openings; forming a positive photoresist layer on a surface of the negative photoresist layer away from the substrate and in the plurality of first sub-openings by a coating process; and exposing and developing the positive photoresist layer to form a plurality of second sub-openings. The negative photoresist layer having the plurality of first sub-openings and the positive photoresist layer having the plurality of second sub-openings together constitute the second pixel defining layer having the plurality of second openings, at least one second opening is composed of a first sub-opening and a corresponding second sub-opening that are communicated to each other.

In some embodiments, a material of the first pixel defining layer is the same as a material of the second pixel defining layer, and the first pixel defining layer and the second pixel defining layer are formed in a single manufacturing process.

In some embodiments, a surface of the second pixel defining layer away from the substrate is in a same plane as a surface of the first pixel defining layer away from the substrate.

In some embodiments, all openings in the plurality of first openings and the plurality of second openings are arranged in a matrix in a plane defined by a first direction and a second direction, the first direction being perpendicular to the second direction; in the first direction, any two adjacent openings are equally spaced.

In some embodiments, all openings in the plurality of first openings and the plurality of second openings are arranged in a matrix in a plane defined by a first direction and a second direction, the first direction being perpendicular to the second direction; in the second direction, any two adjacent openings are equally spaced.

In some embodiments, a shape of a cross section of a second opening in a plane of a surface of the second pixel defining layer away from the substrate is the same as a shape of a cross section of a first opening in the plane of the surface of the first pixel defining layer away from the substrate.

In some embodiments, the second pixel defining layer includes a first portion, and a second portion located on a side of the first portion away from the substrate. The first portion is connected with the plurality of first sub-openings, and a material of the first portion includes a negative photoresist. The second portion is connected with the plurality of second sub-openings, and a material of the second portion includes a positive photoresist.

In some embodiments, a minimum area of the cross section of the second sub-opening is the same as a minimum area of the cross section of the first sub-opening.

In some embodiments, in at least one second opening, a capacity of the first sub-opening is equal to a capacity of the second sub-opening.

In some embodiments, the display substrate is an organic light-emitting diode substrate.

In some embodiments, the method of manufacturing the display substrate further includes: forming at least one organic layer in each second opening and each first opening by an inkjet printing process.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely some embodiments of the present disclosure, and a person of ordinary skill in the art can obtain other drawings according to these drawings without paying any creative effort.

FIG. 5 is a schematic flow chart of a method of manufacturing a display substrate according to some embodiments of the present disclosure;

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of some embodiments of the present disclosure by a person of ordinary skill in the art without paying any creative effort shall be included in the protection scope of the present disclosure.

Figure 1:
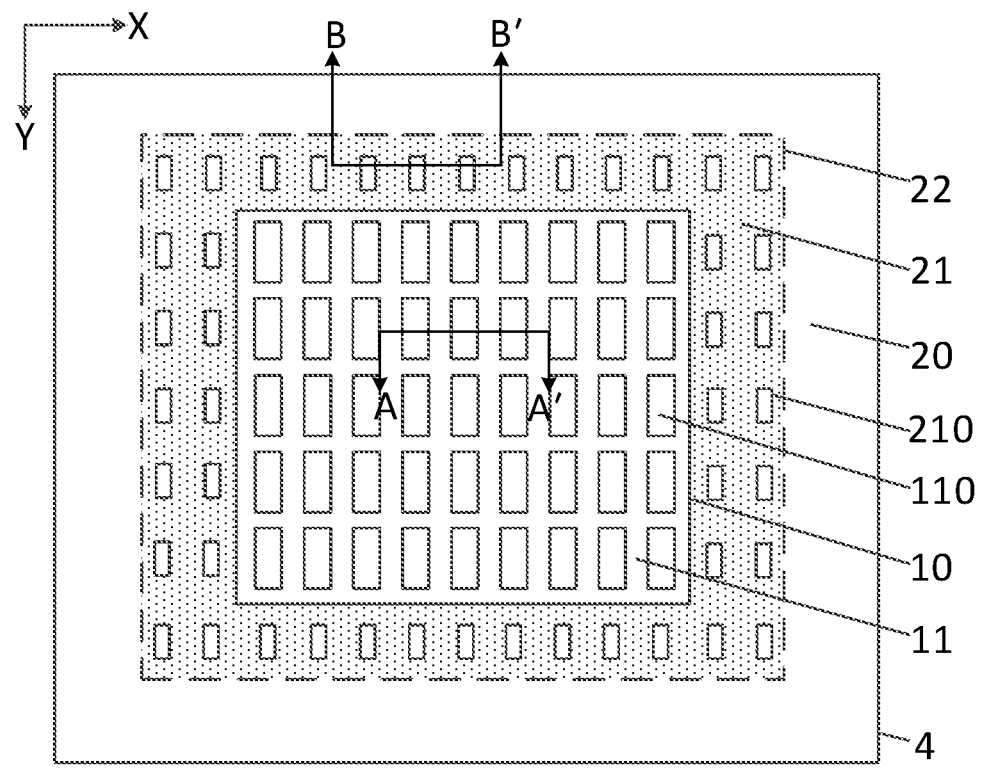
FIG. 1 is a schematic top view of a display substrate according to some embodiments of the present disclosure.

Some embodiments of the present disclosure provide a display substrate. As shown in FIG. 1, the display substrate includes: a display area 10 and a non-display area 20, and the non-display area 20 includes a dummy pixel area 22 located in a periphery of the display area 10 (that is, a portion outside the display area 10 and inside a dotted box in FIG. 1). The display substrate further includes a substrate 4; a first pixel defining layer 11 disposed on the substrate 4 and located in the display area 10, the first pixel defining layer 11 being provided with a plurality of first openings 110; and a second pixel defining layer 21 disposed on the substrate 4 and located in the dummy pixel area 22, the second pixel defining layer 21 being provided with a plurality of second openings 210.

A capacity of each second opening 210 is greater than a capacity of each first opening 110, and an open area of each second opening 210 is less than or equal to an open area of each first opening 110. The open area of a cross section of each second opening 210 is an area of each second opening 210 in a plane of a surface of the second pixel defining layer 21 away from the substrate 4, and the open area of each first opening 110 is an area of a cross section of each first opening 110 in a plane of a surface of the first pixel defining layer 11 away from the substrate 4.

It will be noted that, the plurality of first openings 110 in the first pixel defining layer 11 are in one-to-one correspondence with a plurality of sub-pixels in the display area 10, and the plurality of second openings 210 in the second pixel defining layer 21 are in one-to-one correspondence with a plurality of sub-pixels in the dummy pixel area 22. A structure of each sub-pixel in the dummy pixel area 22 is the same as a structure of each sub-pixel in the display area 10. However, since the dummy pixel area 22 is located in the non-display area 20, sub-pixels in the dummy pixel area 22 do not display content.

In addition, as for the display substrate, a display element is generally provided in each sub-pixel. For example, in some embodiments, the display substrate is an OLED substrate, and an OLED element is provided as a display element in each sub-pixel of the OLED substrate. The OLED element includes an anode, at least one organic layer, and a cathode. The at least one organic layer at least includes a light-emitting layer. The anode is generally formed before a pixel defining layer is formed, and the organic layer is formed within a plurality of openings (including the first openings 110 and the second openings 210) in the pixel defining layer. That is, as for the plurality of sub-pixels in the display area 10, anodes are formed first, then a first pixel defining layer 11 is formed, and then an organic layer is formed in the plurality of first openings 110 in the first pixel defining layer 11. An edge of the anode may extend below the first pixel defining layer 11. As for the plurality of sub-pixels in the dummy pixel area 22, anodes are formed first, then a second pixel defining layer 21 is formed, and then an organic layer is formed in the plurality of second openings 210 in the second pixel defining layer 21. An edge of the anode may extend below the second pixel defining layer 21.

Of course, in some other embodiments, the display substrate may be a quantum dot light emitting diode (QLED) substrate, a color filter substrate, or any other substrate that needs to be formed by an inkjet printing process, which is allowed and not limited in some embodiments of the present disclosure.

It will be understood that, in some embodiments of the present disclosure, since the dummy pixel area 22 located in the periphery of the display area is provided with a plurality of sub-pixels that are not for display, the plurality of sub-pixels in the dummy pixel area 22 that are located at an edge area of the display substrate may be used to solve a problem that a drying speed of an organic solvent at the edge area of the display area 10 is faster than a drying speed of the organic solvent in an central area of the display area 10 in a process of inkjet printing the organic material having the organic solvent to form an organic layer.

However, since an area occupied by the dummy pixel area 22 in the display substrate is limited, in some embodiments of the present disclosure, it is arranged that the capacity of each second opening 210 is greater than the capacity of each first opening 110. In this way, each second opening 210 can hold more organic solvent relative to each first opening 110, and the dummy pixel area 22 can provide a sufficient solvent atmosphere for the edge area of the display area 10 in the process of inkjet printing the organic material having the organic solvent to form an organic layer. Therefore, it is ensured that the drying speed of the organic solvent in the edge area of the display area 10 becomes closer to the drying speed of the organic solvent in the central area of the display area 10. Herein, the above solvent atmosphere refers to an atmosphere formed by a large amount of gas accumulated in a certain region after the organic solvent is evaporated.

Based on this, according to the Mazak (B. T. M) Formula (an empirical formula for calculating the evaporation of an organic solvent, $Gs=(5.38+4.1\ u) \times Pv \times F \times \sqrt{M}$; Gs is an evaporation amount of an organic solvent, u is a flow rate of dry ambient air, Pv is a saturated vapor pressure of the organic solvent, F is an exposed area of the organic solvent, and M is a molecular weight of the organic solvent), it is known that the evaporation amount of the organic solvent is related to the exposed area of the organic solvent. Since the organic solvent is printed into all openings of the pixel defining layer, the evaporation amount of the organic solvent is actually related to an open area of the openings. In some embodiments of the present disclosure, it is arranged that the open area of each second opening 210 is less than or equal to the open area of each first opening 110, so that an evaporation rate of the organic solvent contained in each second opening 210 is not more than an evaporation rate of the organic solvent contained in each first opening 110. In this way, it is possible to ensure that the organic solvent in each second opening 210 can provide the solvent atmosphere for the edge area of the display area 10 throughout a process of drying the organic solvent in each first opening 110.

Based on the above, in the display substrate provided in some embodiments of the present disclosure, the first pixel defining layer 11 is disposed in the display area 10, the second pixel defining layer 21 is disposed in the dummy pixel area 22, and it is arranged that the capacity of each second opening 210 in the second pixel defining layer 21 is greater than the capacity of each first opening 110 in the first pixel defining layer 11. In this way, each first opening 210 may be able to hold more organic solvent than each first opening 110 in the process of inkjet printing the organic material having the organic solvent to form an organic layer. As a result, a sufficient solvent atmosphere may be provided for the edge area of the display area 10, and the drying speed of the organic solvent in each first opening 110 in the edge area of the display area 10 may be decreased. Therefore, the drying speed of the organic solvent in the edge area of the display area 10 may become closer to the drying speed of the organic solvent in the central area of the display area 10.

Moreover, in the display substrate provided in some embodiments of the present disclosure, by setting the open area of each second opening 210 to be less than or equal to the open area of each first opening 110, it may be possible to make the evaporation rate of the organic solvent contained in each second opening 210 not more than the evaporation rate of the organic solvent in each first opening 110. Therefore, it may be ensured that the organic solvent in each second opening 210 in the dummy pixel area 22 provides a solvent atmosphere for the edge area of the display area 10 throughout the process of drying the organic solvent in each first opening 110, As a result, a film thickness uniformity of the organic layer in all sub-pixels in the edge area and the central area of the display area 10 may be improved.

It will be understood that, since the structure of each sub-pixel in the dummy pixel area 22 is the same as the structure of each sub-pixel in the display area 10, the surface of the second pixel defining layer 21 away from the substrate 4 is in a same plane as the surface of the first pixel defining layer 11 away from the substrate 4. That is, a height of the second opening 210 is equal to a height of the first opening 110 in a case where a surface of the substrate 4 (i.e., a surface of the substrate 4 provided with the above structures) is used as a reference plane. In this way, during a process of inkjet printing the organic solvent into each second opening 210 and each first opening 110, a plurality of nozzles arranged continuously may be adopted to inkjet print the organic solvent at the same time. In this way, not only a printing efficiency may be improved, but also a printing complexity may be reduced. That is, a problem that multiple printing processes need to be carried out due to a difference in heights of the second opening 210 and the first opening 110 may be avoided.

Optionally, as shown in FIG. 1, all openings in the plurality of first openings 110 in the first pixel defining layer 11 and the plurality of second openings 210 in the second pixel defining layer 21 are arranged in a matrix in a plane defined by a first direction X and a second direction Y, and the first direction X is perpendicular to the second direction Y. In the first direction X, any two adjacent openings are equally spaced; and in the second direction Y, any two adjacent openings are equally spaced.

Based on the above structure, no matter whether the plurality of nozzles arranged continuously print the organic solvent along the first direction X or along the second direction Y, the organic solvent coming out from the nozzles may accurately fall into the corresponding plurality of first openings 110 and/or plurality of second openings 210, which is conducive to improving an accuracy of inkjet printing.

In some embodiments, a shape of each second opening 210 in the plane of the surface of the second pixel defining layer 21 away from the substrate 4 is the same as a shape of each first opening 110 in the plane of the surface of the first pixel defining layer 11 away from the substrate 4. In this way, during an inkjet printing process, the organic solvent falling into the first opening 110 and the second opening 210 may be more uniform, thereby further ensuring the film thickness uniformity of the organic layer in each opening. Optionally, the shape of a cross section of the second opening 210 in the plane of the surface of the second pixel defining layer 21 away from the substrate 4 may be set to, according to actual needs, for example, a circle, a square, a diamond, or a rectangle, which is not limited in some embodiments of the present disclosure.

Figure 2:
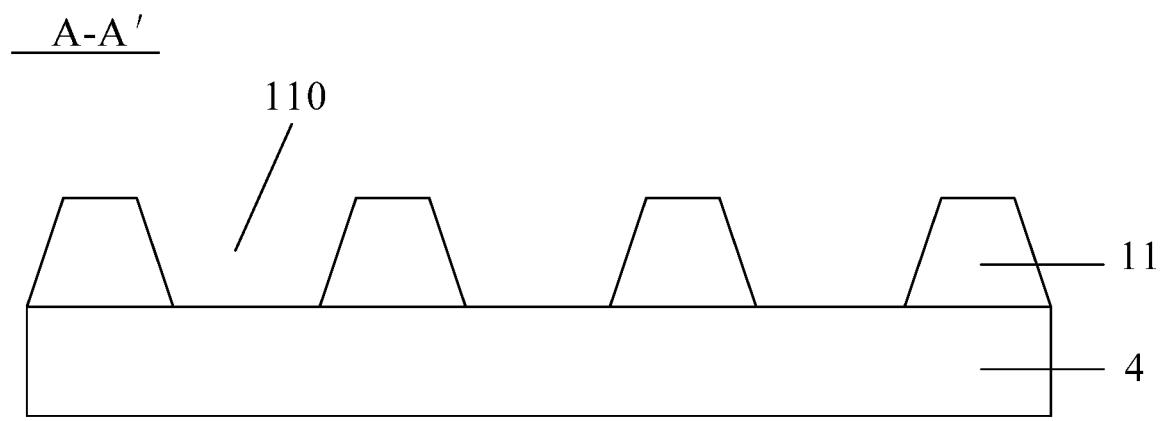
FIG. 2 is a schematic cross-sectional view taking along line AA' in the display substrate shown in FIG. 1.

It is worth mentioning that, in some embodiments, as shown in FIG. 2, in a direction from each first opening 110 to the substrate 4, an area of a cross section of each first opening 110 decreases progressively. That is, the area of the cross section of each first opening 110 parallel to a surface of the substrate 4 (i.e., a surface of the substrate 4 provided with the above structures) decreases progressively. For example, a shape of a cross section of each first opening 110 perpendicular to the surface of the substrate 4 is an inverted trapezoid.

Figure 3:
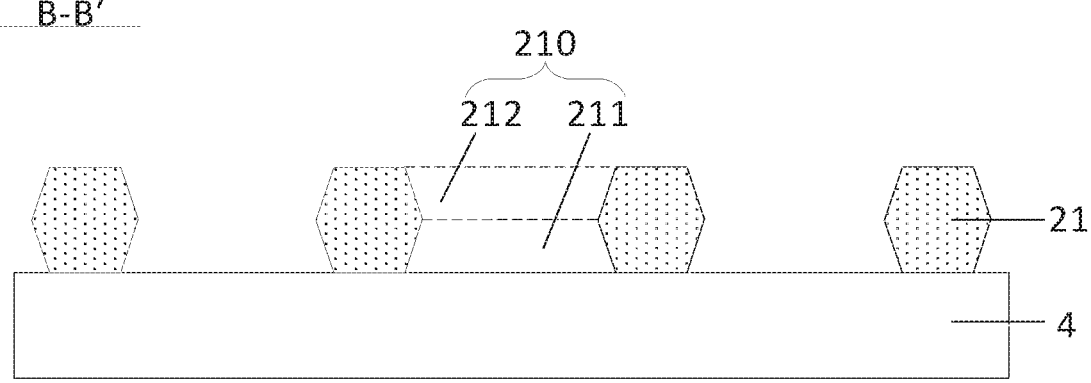
FIG. 3 is a schematic cross-sectional view taking along line BB' in the display substrate shown in FIG. 1.

As shown in FIG. 3, each second opening 210 includes a first sub-opening 211, and a second sub-opening 212 that is located on a side of the first sub-opening 211 away from the substrate 4 and communicated with the first sub-opening 110. In a direction from each second opening 210 to the substrate 4, an area of a cross section of the second sub-opening 212 decreases progressively, an area of a cross section of the first sub-opening 211 increases progressively, and a minimum area of the cross section of the second sub-opening 212 is the same as a minimum area of the cross section of the first sub-opening 211. That is, the area of the cross section of each first sub-opening 211 parallel to the surface of the substrate 4 increases progressively. For example, a shape of a cross section of each first sub-opening 211 perpendicular to the surface of the substrate 4 is a trapezoid. The area of the cross section of each second sub-opening 212 parallel to the surface of the substrate 4 decreases progressively. For example, a shape of a cross section of each second sub-opening 211 perpendicular to the surface of the substrate 4 is an inverted trapezoid.

Herein, the shape of a cross section is an inverted trapezoid means that, in opposite sides of the cross section that are parallel to the surface of the substrate 4, a length of one side away from the substrate 4 is greater than a length of another side proximate to the substrate 4.

Based on this, even in a case where a height of each second opening 210 is equal to a height of each first opening 110, and the open area of each second opening 210 is the same as the open area of each first opening 110, in the display substrate provided in some embodiments of the present disclosure, it may be possible to make the capacity of each second opening 210 greater than the capacity of each first opening 110. Therefore, it may be ensured that each second opening 210 can hold more organic solvent than each first opening 110. As a result, the organic solvent in each second opening 210 in the dummy pixel area 22 may be able to provide a sufficient solvent atmosphere for the plurality of first openings 110 in the edge area of the display area 10.

In addition, as shown in FIG. 3, in each second opening 210, in the case where the surface of the substrate 4 is used as a reference plane, a height of the first sub-opening 211 is the same as a height of the second sub-opening 212, and a capacity of each first sub-opening 211 is equal to a capacity of each second sub-opening 212. In this way, the first sub-opening 211 and the second sub-opening 212 in each second opening 210 are symmetrically arranged along a boundary plane therebetween, which makes it easier to manufacture the second pixel defining layer 21 in terms of process.

Figure 4:
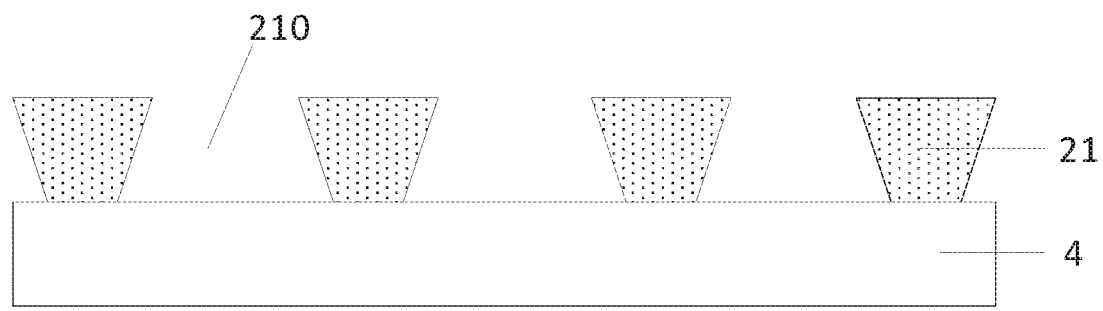
FIG. 4 is another schematic cross-sectional view taking along line BB' in the display substrate shown in FIG. 1.

Of course, in some embodiments, as shown in FIG. 2, in a direction from each first opening 110 to the substrate 4, the area of the cross-section of each first opening 110 decreases progressively. For example, a shape of a cross-section of each first opening 110 perpendicular to the surface of the substrate 4 is an inverted trapezoid. In some embodiments, as shown in FIG. 4, in a direction from each second opening 210 to the substrate 4, the area of the cross-section of each second opening 210 increases progressively. For example, a shape of a cross-section of each second opening 210 perpendicular to the surface of the substrate 4 is a trapezoid.

Based on this, in the case where the height of the second opening 210 is equal to the height of the first opening 110, and the open area of the second opening 210 is the same as the open area of the first opening 110, since in a same plane parallel to the surface of the substrate 4, the area of the cross section of each second opening 210 is greater than the area of the cross section of each first opening 110, the capacity of each second opening 210 may be greater than the capacity of each first opening 110. Moreover, a shape of each second opening 210 is similar to a shape of each first opening 110 inverted, which makes it easier to manufacture the second pixel defining layer 21 in terms of process.

In some embodiments, the first pixel defining layer 11 and the second pixel defining layer 21 are both photoresist layers. In this way, in the process of manufacturing the first pixel defining layer 11 and the second pixel defining layer 21, it is only necessary to perform such processes as gluing, exposure, and development, making the manufacturing process thereof simpler. Optionally, the photoresist may include a positive photoresist or a negative photoresist.

Figure 9:
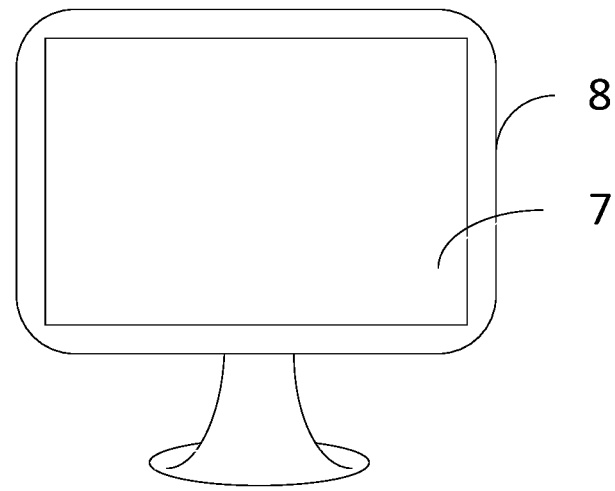
FIG. 9 is a schematic diagram showing a structure of a display device according to some embodiments of the present disclosure.

Some embodiments of the present disclosure provide a display device. As shown in FIG. 9, the display device 8 includes the display substrate 7 described above. The display device 8 has the same technical effects as those of the display substrate described above, and details are not described herein again.

Some embodiments of the present disclosure provide a method of manufacturing a display substrate. Referring to FIGS. 1 and 5, the method of manufacturing a display substrate includes step 100 to step 300 (S100~S300).

In S100, a first pixel defining layer 11 is formed on a portion of a substrate 4 located in a display area 10, and the first pixel defining layer 11 has a plurality of first openings 110.

In S200, a second pixel defining layer 21 is formed on a portion of the substrate 4 located in a non-display area 20, and the second pixel defining layer 21 has a plurality of second openings 210. A capacity of each second opening 210 is greater than a capacity of each first opening 110, and an open area of each second opening 210 is less than or equal to an open area of each first opening 110. The open area of each second opening 210 is an area of a cross section of each second opening 210 in a plane of a surface of the second pixel defining layer 21 away from the substrate 4, and the open area of each first opening 110 is an area of a cross section of each first opening 110 in a plane of a surface of the first pixel defining layer 11 away from the substrate 4.

In S300, at least one organic layer is formed in each second opening 210 and each first opening 110 by an inkjet printing process.

The beneficial effects of the method of manufacturing a display substrate provided in some embodiments of the present disclosure are the same as those of the display substrate provided in some embodiments above, and details are not described herein again.

It will be noted that, an order of S100 (manufacturing the first pixel defining layer 11 and the plurality of first openings 110) and S200 (manufacturing the second pixel defining layer 21 and the plurality of second openings 210) is not limited. That is, S100 may be implemented first, or S200 may be implemented first, and of course, S100 and S200 may be implemented simultaneously.

In some embodiments, the first pixel defining layer 11 and the second pixel defining layer 21 are both photoresist layers, and are both formed by exposure and development processes.

Figure 6:
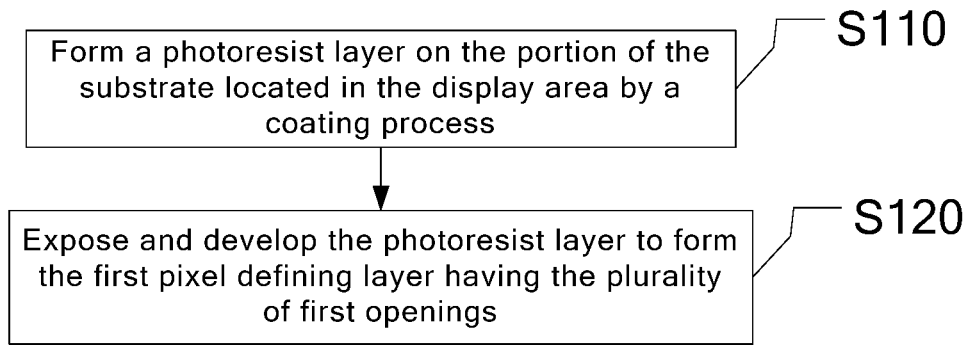
FIG. 6 is a schematic flow chart of manufacturing a first pixel defining layer according to some embodiments of the present disclosure.
Figure 7:
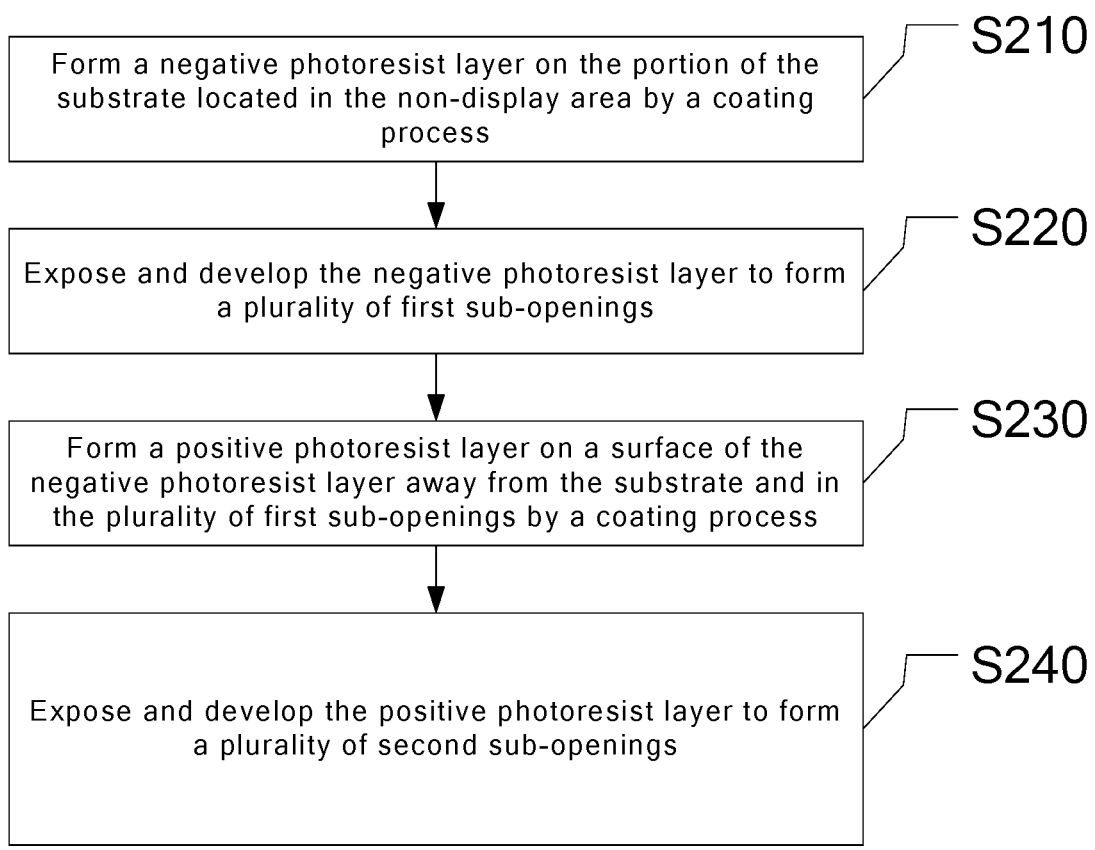
FIG. 7 is a schematic flow chart of manufacturing a second pixel defining layer according to some embodiments of the present disclosure.

For example, as shown in FIG. 6, S100 of forming a first pixel defining layer 11 on a portion of a substrate 4 located in a display area 10, the first pixel defining layer 11 having a plurality of first openings 110, includes step 110 and step 120 (S110~S120).

In S110, a photoresist layer is formed on the portion of the substrate 4 located in the display area by a coating process.

In S120, the photoresist layer is exposed and developed to form the first pixel defining layer 11 provided with the plurality of first openings 110.

For example, referring to FIGS. 7 and 8a~8d, S200 of forming a second pixel defining layer 21 on a portion of the substrate 4 located in a non-display area 20, the second pixel defining layer 21 having a plurality of second openings 210, includes step 210 to step 240 (S210~S240).

Figure 8A:
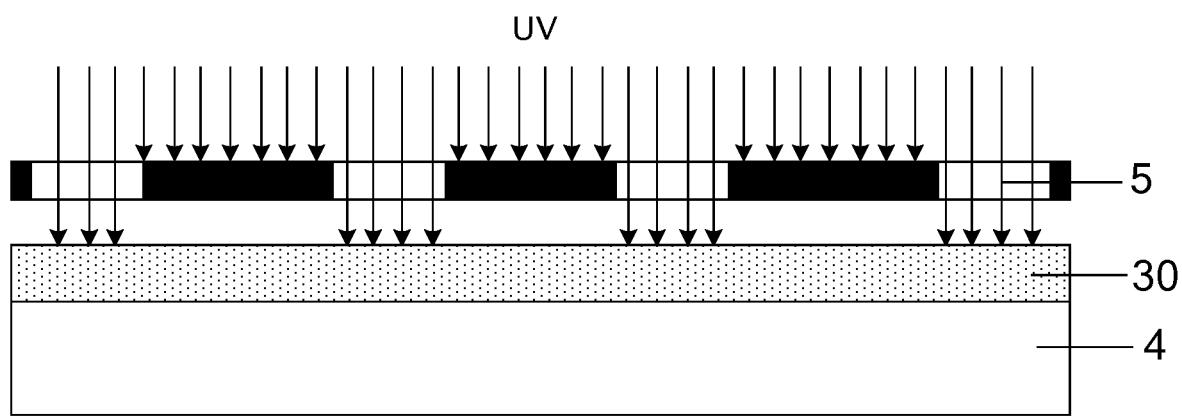
FIGS. 8a to 8d are schematic diagrams showing steps of manufacturing a second pixel defining layer according to some embodiments of the present disclosure.

In S210, a negative photoresist layer 30 is formed on the portion of the substrate 4 located in the non-display area 20 by a coating process, as shown in FIG. 8a.

Figure 8B:
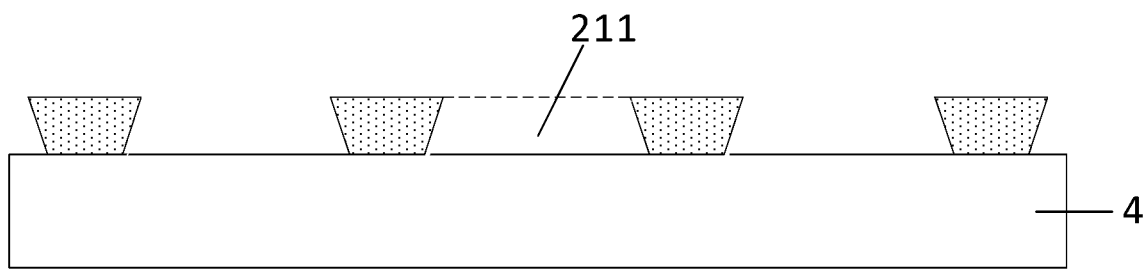

In S220, the negative photoresist layer 30 is exposed and developed to form a plurality of first sub-openings 211, as shown in FIGS. 8a and 8b.

Figure 8C:
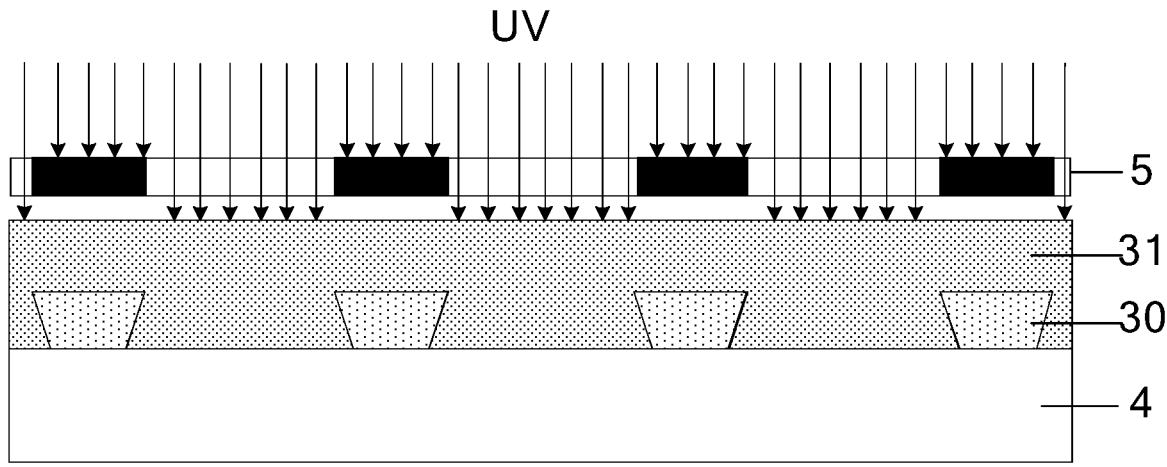

In S230, a positive photoresist layer 31 is formed on a surface of the negative photoresist layer 30 away from the substrate 4 and in the plurality of first sub-openings 211 by a coating process, as shown in FIG. 8c.

Figure 8D:
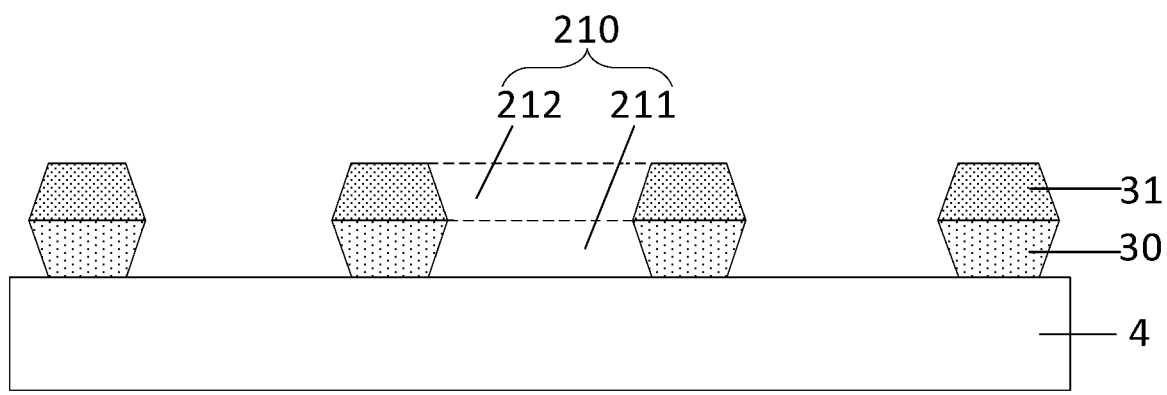

In S240, the positive photoresist layer 31 is exposed and developed to form a plurality of second sub-openings 212, as shown in FIGS. 8c and 8d. The negative photoresist layer 30 having the plurality of first sub-openings 211 and the positive photoresist layer 31 having the plurality of second sub-openings 212 together constitute the second pixel defining layer 21 having the plurality of second openings 210. Each second opening 210 is composed of a first sub-opening 211 and a corresponding second sub-opening 212 that are communicated to each other, as shown in FIG. 8d.

It will be noted that, since the negative photoresist can generate a photochemical reaction under ultraviolet (UV) light irradiation, a polymer compound in the negative photoresist may be cross-linked into a molecular structure insoluble in an alkaline developing solution. Therefore, optionally, the negative photoresist layer 30 is exposed by UV light. Before the negative photoresist layer 30 is exposed, a mask 5 is disposed at a side of the negative photoresist layer 30 away from the substrate 4, so as to use the mask 5 to expose a plurality of areas of the negative photoresist layer 30. After the negative photoresist layer 30 is exposed by UV light, unexposed areas of the negative photoresist layer 30 are soluble in a developing solution, and exposed areas of the negative photoresist layer 30 are insoluble in the developing solution.

Moreover, considering that during a process in which the negative photoresist layer 30 is exposed to UV light, since the negative photoresist layer 30 has a certain thickness, a UV light intensity in each of the plurality of areas decreases progressively along a direction from the mask 5 to the substrate 4.

That is, in each area that is exposed to UV light, an intensity of the photochemical reaction decreases progressively along the direction from the mask 5 to the substrate 4. The closer to the substrate 4, the weaker the photochemical reaction. As a result, along the direction from the mask 5 to the substrate 4, less and less portions of the negative photoresist layer 30 are insoluble in the developing solution.

Furthermore, after the exposed negative photoresist layer 30 is developed, a pattern as shown in FIG. 8b may be finally formed.

After a plurality of first sub-openings 211 are formed, a positive photoresist layer 31 is formed on the surface of the negative photoresist layer 30 away from the substrate 4 and in the plurality of first sub-openings 211 by a coating process. Both the positive photoresist layer 31 and the negative photoresist 30 need to be exposed to light and developed, so as to form desired patterns. The difference lies in that, a principle of exposure and development of the positive photoresist layer 31 is different from that of the negative photoresist 30. That is, after the positive photoresist layer 31 is exposed to UV light, exposed areas of the positive photoresist layer 31 are soluble in the developing liquid, and unexposed areas are insoluble in the developing liquid. Therefore, by performing exposure and development processes on the positive photoresist layer 31, a pattern as shown in FIG. 8d may be finally formed. That is, a plurality of second openings 210 are formed in the second pixel defining layer 21, such that each second opening 210 is composed of a first sub-opening 211 and a second sub-opening 212 that are communicated to each other.

It will be noted that, the foregoing is only one method of manufacturing the second pixel defining layer 21. In fact, according to a material of the second pixel defining layer 21 and a corresponding structure of each second opening 210, a common mask or a halftone mask may be used to manufacture the second pixel defining layer 21. Of course, the same is true for the first pixel defining layer 11, and a material thereof may be a positive photoresist or a negative photoresist.

For example, the first pixel defining layer 11 and the second pixel defining layer 21 are made of a same material, and the first pixel defining layer 11 and the second pixel defining layer 21 may be simultaneously formed in a single manufacturing process, so as to simplify a manufacturing process of the display substrate. Of course, if a material of the first pixel defining layer 11 is different from a material of the second pixel defining layer 21, the first pixel defining layer 11 and the second pixel defining layer 21 may be manufactured separately.

In the description of the above embodiments, specific features, structures, materials or characteristics may be combined in an appropriate manner in any one or more embodiments or examples.

The above descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, having: a display area and a non-display area, the non-display area including a dummy pixel area located in a periphery of the display area, wherein the display substrate comprises:
   a substrate;
   a first pixel defining layer disposed on the substrate and located in the display area, the first pixel defining layer having a plurality of first openings; and a second pixel defining layer disposed on the substrate and located in the dummy pixel area, the second pixel defining layer having a plurality of second openings; wherein a capacity of a second opening of the plurality of second openings is greater than a capacity of a first opening of the plurality of first openings, and an open area of each second opening of the plurality of second openings is less than an open area of each first opening of the plurality of first openings; wherein the open area of each second opening of the plurality of second openings is an area of a cross section of each second opening of the plurality of second openings in a plane of a surface of the second pixel defining layer furthest away from the substrate, and the open area of each first opening of the plurality of first openings is an area of a cross section of each first opening of the plurality of first openings in a plane of a surface of the first pixel defining layer furthest away from the substrate.

2. The display substrate according to claim 1, wherein a shape of a cross section of each first opening of the plurality of first openings perpendicular to a surface of the substrate is an inverted trapezoid;

at least one second opening of the plurality of second openings includes a first sub-opening, and a second sub-opening that is located on a side of the first sub-opening away from the substrate and communicated with the first sub-opening; a shape of a cross section of the first sub-opening perpendicular to the surface of the substrate is a trapezoid; and a shape of a cross section of the second sub-opening perpendicular to the surface of the substrate is an inverted trapezoid.

3. The display substrate according to claim 2, wherein the second pixel defining layer includes a first portion and a second portion disposed in sequence along a direction away from the substrate; wherein the first portion is connected with a plurality of the first sub-openings, and a material of the first portion includes a negative photoresist;

the second portion is connected with a plurality of the second sub-openings, and a material of the second portion includes a positive photoresist; and a surface of the first portion away from the substrate is in direct contact with a surface of the second portion proximate to the substrate.

4. The display substrate according to claim 2, wherein a minimum area of the cross section of the second sub-opening in a plane parallel to a plane of the surface of the substrate is the same as a minimum area of the cross section of the first sub-opening in the plane parallel to the plane of the surface of the substrate.

5. The display substrate according to claim 2, wherein in the at least one second opening of the plurality of second openings, a height of the first sub-opening is the same as a height of the second sub-opening.

6. The display substrate according to claim 5, wherein in the at least one second opening of the plurality of second openings, a capacity of the first sub-opening is equal to a capacity of the second sub-opening.

7. The display substrate according to claim 1, wherein a shape of a cross section of at least one first opening of the plurality of first openings perpendicular to a surface of the substrate is an inverted trapezoid, and a shape of a cross section of at least one second opening of the plurality of second openings perpendicular to the surface of the substrate is a trapezoid.

8. The display substrate according to claim 1, wherein the first pixel defining layer and the second pixel defining layer are both photoresist layers.

9. The display substrate according to claim 1, wherein the surface of the second pixel defining layer furthest away from the substrate is in a same plane as the surface of the first pixel defining layer furthest away from the substrate.

10. The display substrate according to claim 1, wherein a shape of a cross section of a second opening of the plurality of second openings in the plane of the surface of the second pixel defining layer furthest away from the substrate is the same as a shape of a cross section of a first opening of the plurality of first openings in the plane of the surface of the first pixel defining layer furthest away from the substrate.

11. The display substrate according to claim 1, wherein the display substrate is an organic light-emitting diode substrate.

12. A display device, comprising the display substrate according to claim 1.

13. A method of manufacturing a display substrate, comprising:

forming a first pixel defining layer on a portion of a substrate located in a display area, the first pixel defining layer having a plurality of first openings; and forming a second pixel defining layer on a portion of the substrate located in a non-display area, the second pixel defining layer having a plurality of second openings; wherein a capacity of a second opening of the plurality of second openings is greater than a capacity of a first opening of the plurality of first openings, and an open area of each second opening of the plurality of second openings is less than an open area of each first opening of the plurality of first openings; wherein the open area of each second opening of the plurality of second openings is an area of a cross section of each second opening of the plurality of second openings in a plane of a surface of the second pixel defining layer furthest away from the substrate, and the open area of each first opening of the plurality of first openings is an area of a cross section of each first opening of the plurality of first openings in a plane of a surface of the first pixel defining layer furthest away from the substrate.

14. The method of manufacturing the display substrate according to claim 10, wherein the forming the first pixel defining layer on the portion of the substrate located in the display area, the first pixel defining layer having the plurality of first openings, includes:

forming a photoresist layer on the portion of the substrate located in the display area by a coating process; and exposing and developing the photoresist layer to form the first pixel defining layer having the plurality of first openings.

15. The method of manufacturing the display substrate according to claim 13, wherein the forming the second pixel defining layer on the portion of the substrate located in the non-display area, the second pixel defining layer having the plurality of second openings, includes:

forming a negative photoresist layer on the portion of the substrate located in the non-display area by a coating process;

exposing and developing the negative photoresist layer to form a plurality of first sub-openings;

forming a positive photoresist layer on a surface of the negative photoresist layer away from the substrate and in the plurality of first sub-openings by a coating process; and exposing and developing the positive photoresist layer to form a plurality of second sub-openings; wherein the negative photoresist layer having the plurality of first sub-openings and the positive photoresist layer having the plurality of second sub-openings together constitute the second pixel defining layer having the plurality of second openings, at least one second opening of the plurality of second openings being composed of a first sub-opening of the plurality of first sub-openings and a corresponding second sub-opening of the plurality of second sub-openings that are communicated to each other.

16. The method of manufacturing the display substrate according to claim 13, wherein a material of the first pixel defining layer is the same as a material of the second pixel defining layer, and the first pixel defining layer and the second pixel defining layer are formed in a single manufacturing process.

17. The method of manufacturing the display substrate according to claim 13, further comprising:

forming at least one organic layer in each second opening of the plurality of second openings and each first opening of the plurality of first openings by an inkjet printing process.

\* \* \* \* \*

UNITED STATES PATENT AND TRADEMARK OFFICE
CERTIFICATE OF CORRECTION

PATENT NO. : 11,678,557 B2
APPLICATION NO. : 16/616025
DATED : June 13, 2023
INVENTOR(S) : Chunjing Hu et al.

Page 1 of 1

It is certified that error appears in the above-identified patent and that said Letters Patent is hereby corrected as shown below:

In the Claims

In Claim 14, at Column 12, Line 48, please delete "10" and add --13-- after "...according to claim..."

Signed and Sealed this
Fifth Day of March, 2024

Katherine Kelly Vidal
*Director of the United States Patent and Trademark Office*